United States Patent
Yang

(10) Patent No.: US 6,803,726 B2
(45) Date of Patent: Oct. 12, 2004

(54) NOISE FILTER OF HIGH FREQUENCY GENERATOR

(75) Inventor: Sung-Chol Yang, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 18 days.

(21) Appl. No.: 10/393,287

(22) Filed: Mar. 21, 2003

(65) Prior Publication Data

US 2004/0070345 A1 Apr. 15, 2004

(30) Foreign Application Priority Data

Oct. 12, 2002 (KR) ................................ 10-2002-0062295

(51) Int. Cl.[7] ................................................. H01J 25/50
(52) U.S. Cl. .................... 315/39.51; 315/5.13; 333/182
(58) Field of Search ............................. 315/39.51, 5.13, 315/39.55, 39.71; 219/761, 738; 333/181, 182

(56) References Cited

U.S. PATENT DOCUMENTS

| 3,922,612 A | * 11/1975 | Tashiro ...................... 219/741 |
| 4,131,824 A | 12/1978 | Nakai et al. ............. 315/39.51 |
| 4,720,658 A | * 1/1988 | Tsuzurahara ............. 315/39.51 |
| 5,432,405 A | * 7/1995 | Ochiai et al. ............ 315/39.51 |

FOREIGN PATENT DOCUMENTS

| JP | 10-241586 | * 9/1998 |
| KR | 1999-72650 | 9/1999 |

* cited by examiner

Primary Examiner—Ephrem Alemu
(74) Attorney, Agent, or Firm—Staas & Halsey LLP

(57) ABSTRACT

A noise filter of a high frequency generator reduces noise of a certain frequency band leaked from the high frequency generator using a structure in which a first core inductor, an air-core inductor and a second core inductor are connected in series to each other. The first and second core inductors have high frequency-energy absorbing members inserted thereinto, and the air-core inductor is not provided with a high frequency-energy absorbing member therein. The high frequency-energy absorbing member is made of one of iron oxide, tin alloy and ferrite. The high frequency-energy absorbing member is also provided with a sectional area in which noise of a frequency band of 400 MHz to 900 MHz is attenuated.

10 Claims, 6 Drawing Sheets

FIG. 2A
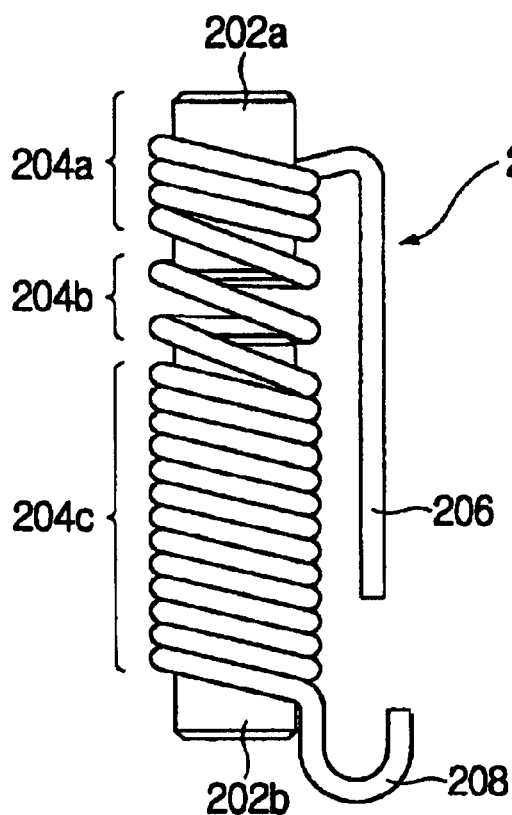
FIG. 2B
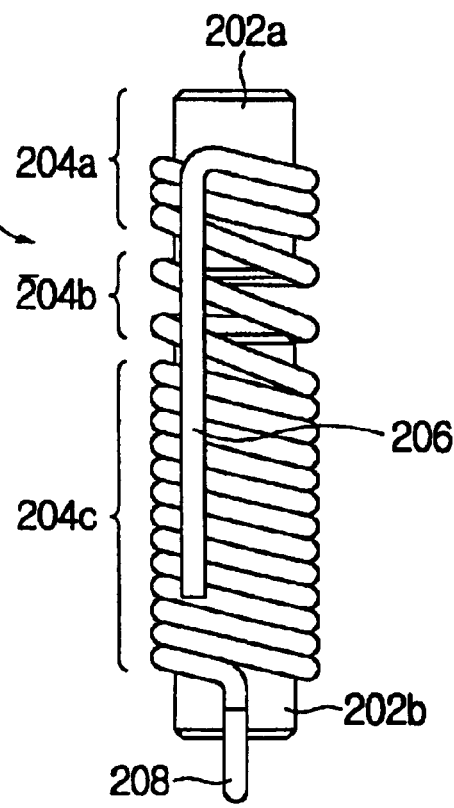
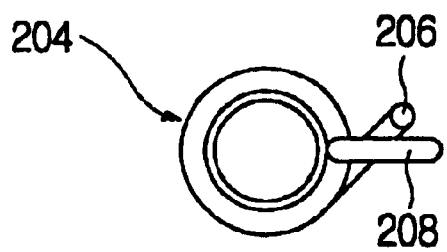
FIG. 2C

NOISE FILTER OF HIGH FREQUENCY GENERATOR

CROSS-REFERENCE TO RELATED APPLICATION

This application claims the benefit of Korean Application No. 2002-62295, filed Oct. 12, 2002, in the Korean Intellectual Property Office, the disclosure of which is incorporated herein by reference.

BACKGROUND OF THE INVENTION

1. Field of the Invention

The present invention relates to a high frequency generator and, more particularly, to a noise filter of a high frequency generator.

2. Description of the Related Art

A high frequency generator, such as a magnetron, a klystron, a traveling wave tube and a semiconductor device, is applied in various fields. The high frequency generator mainly employs a noise filter to prevent undesired leakage of high frequency energy. The leakage of high frequency energy causes noise in electronic devices, such as a television and the like. For this reason, it is important to prevent leakage of high frequency energy from the high frequency generator. Generally, a noise filter includes inductive devices, such as choke coils, a capacitor, a shielding casing and the like, and are connected to an electric conductor to supply power.

FIGS. 1A and 1B are partially sectional and top views of a conventional noise filter of a high frequency generator, respectively. FIGS. 1A and 1B are also shown in Korean Non-examined Patent Publication No. 10-1999-0072650. As shown in FIGS. 1A and 1B, a noise filter 120 is disposed under a magnetron 100. Inside a filter casing 144 of the noise filter 120, choke coils 154, each including a core inductor 150 and an air-core inductor 152 connected in series to each other, are disposed. The core inductors 150 have high frequency-energy absorbing members 148 inserted thereinto, while the air-core inductors 152 do not have the high frequency-energy absorbing members 148 therein. The core inductors 150 are connected to a condenser 158. The air-core inductors 152 are connected to a stem 156 through stem terminals 156a and 156b.

Generally, a core inductor may reduce noise of a frequency band below 400 MHz by regulating a number of coil windings thereof. An air-core inductor may reduce noise of a frequency band ranging from 700 MHz to 1000 MHz by regulating a number of coil windings thereof. In the conventional noise filter shown in FIGS. 1A and 1B, the core inductors 150 and the air-core inductors 152 are connected in series to each other, and sectional areas of the high frequency-energy absorbing members 148 are sized, so noise of a frequency band ranging from 400 MHz to 700 MHz is reduced.

However, although a noise frequency band causing many communication obstacles ranges from 400 MHz to 900 MHz, the conventional noise filter may not reduce noise of a frequency band ranging from 400 MHz to 900 MHz using the core inductors 150, the air-core inductors 152, or a structure in which the core inductor 150 and the air-core inductor 152 are connected in series to each other.

SUMMARY OF THE INVENTION

Accordingly, it is an aspect of the present invention to provide a noise filter of a high frequency generator, which may reduce noise of a certain frequency band leaked from the high frequency generator using a structure in which a core inductor, an air-core inductor and another core inductor are connected in series to each other.

Additional aspects and advantages of the invention will be set forth in part in the description which follows and, in part, will be obvious from the description, or may be learned by practice of the invention.

The foregoing and/or other aspects of the present invention are achieved by providing a noise filter of a high frequency generator having a structure in which a first core inductor, an air-core inductor and a second core inductor are connected in series to each other. The first and second core inductors have high frequency-energy absorbing members inserted thereinto, and the air-core inductor is not provided with a high frequency-energy absorbing member.

According to an aspect of the invention, the high frequency-energy absorbing member is made of one of iron oxide, tin alloy and ferrite.

According to another aspect of the invention, the high frequency-energy absorbing member is provided with a sectional area in which noise of a frequency band ranging from 400 MHZ to 900 MHz is attenuated.

BRIEF DESCRIPTION OF THE DRAWINGS

The above and/or other aspects and advantages of the present invention will become apparent and more readily appreciated from the following description of the preferred embodiments, taken in conjunction with the accompanying drawings of which:

FIGS. 2A and 2B are front views of inductors of a noise filter, according to an embodiment of the present invention;

FIG. 2C is a section view of the inductors of FIGS. 2A and 2B;

DETAILED DESCRIPTION OF THE PREFERRED EMBODIMENTS

Figure 1A:
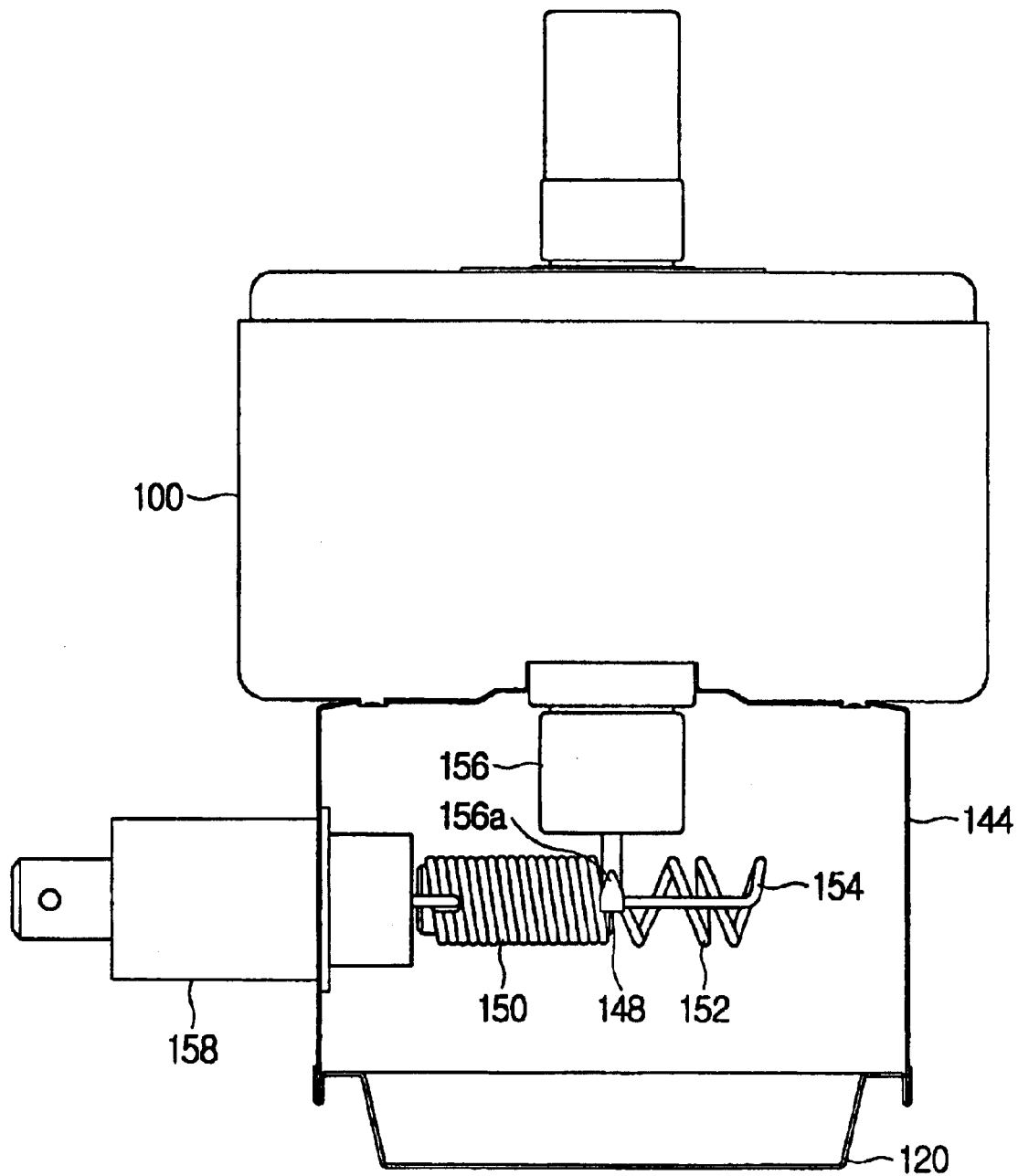
FIG. 1A is a partially sectional view of a conventional noise filter of a high frequency generator.
Figure 1B:
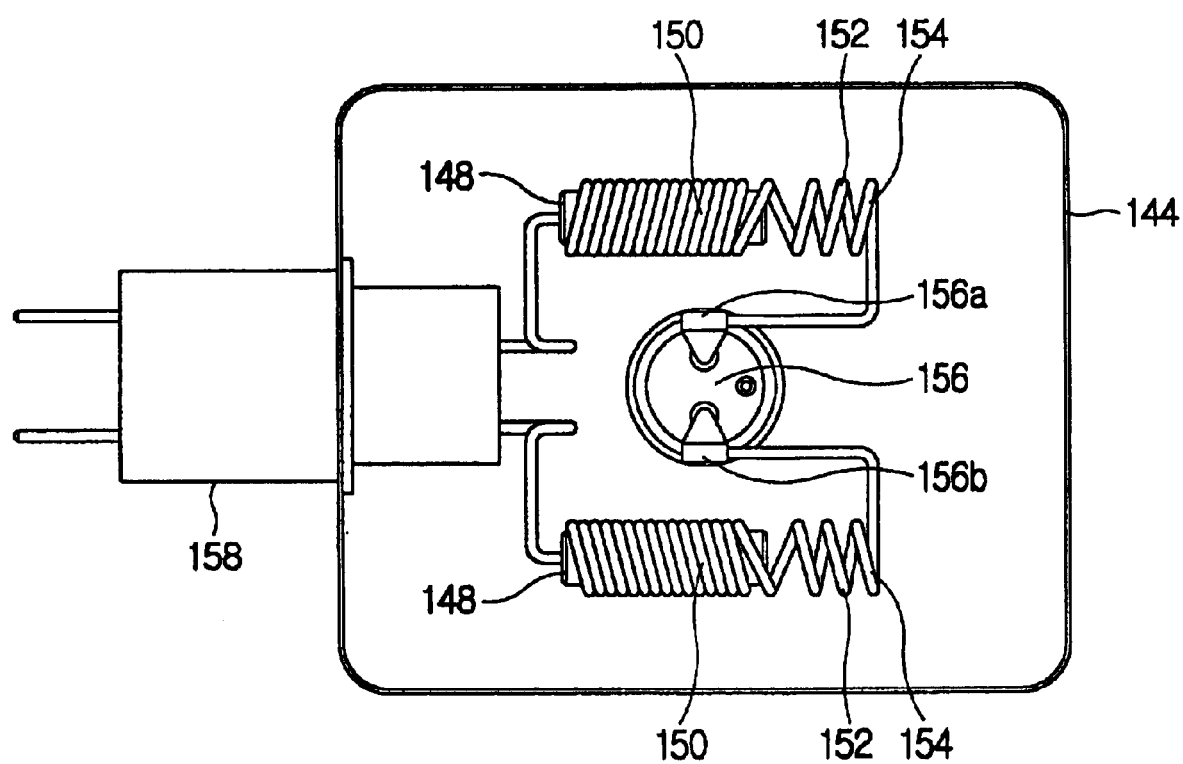
FIG. 1B is a top view of the conventional noise filter of FIG. 1B.

Reference will now be made in detail to the present preferred embodiments of the present invention, examples of which are illustrated in the accompanying drawings, wherein like reference numerals refer to like elements throughout.

Figure 2D:
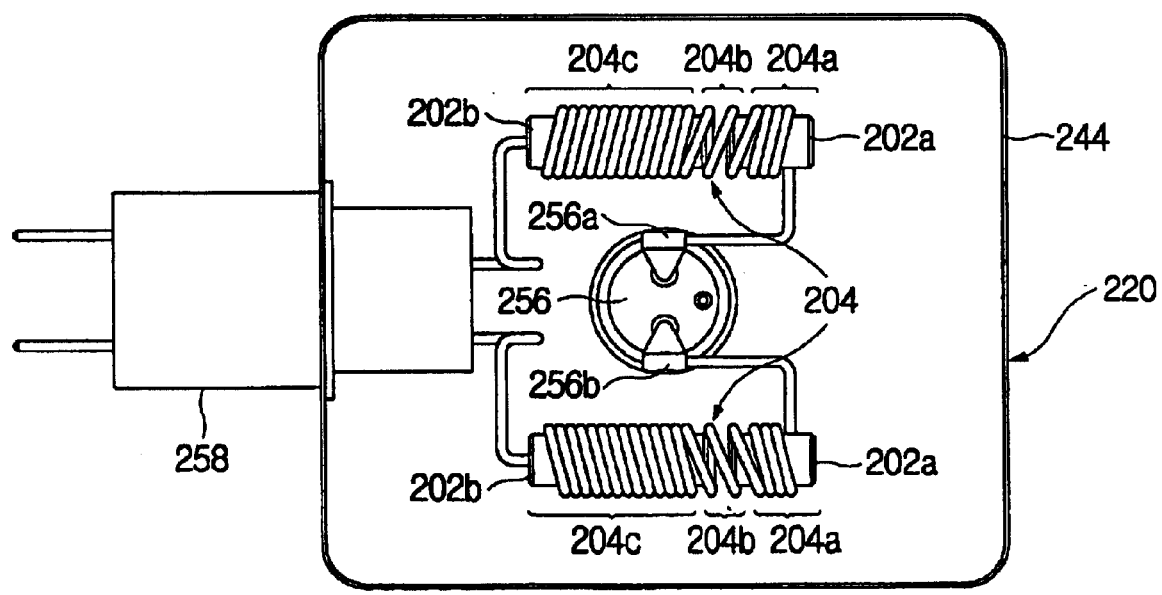
FIG. 2D is a top view of the noise filter of a high frequency generator of the present invention.

A noise filter of a high frequency generator, according to an embodiment of the present invention, is described with reference to FIGS. 2A through 2E, and FIG. 3. FIGS. 2A through 2C are front and sectional views of inductors of the noise filter of the present invention. As shown in FIGS. 2A through 2C, choke coils 204 each have a structure in which a first core inductor 204a, an air-core inductor 204b and a second core inductor 204c are connected in series to each other, and are provided with ends 206 and 208. The first and second core inductors 204a and 204c have a first core 202a and a second core 202b inserted into the first and second core inductors 204a and 204c, respectively. The air-core inductor 204b is exposed to air. The first and second cores 202a and 202b are high frequency-energy absorbing members, respectively, and are made of a magnetic material, such as ferrite, iron or ceramic. The first and second cores 202a and 202b are provided with a sectional area in which noise of a frequency band ranging from 400 MHz to 900 MHz is attenuated.

FIG. 2D is a top view of the noise filter of the high frequency generator of the present invention. As shown in FIG. 2D, the choke coils 204 each including the first core inductor 204a, the air-core inductor 204b and the second core inductor 204b connected in series to each other, are disposed inside a filter casing 244 of a noise filter 220. The first and second core inductors 204a and 204c have the first and second cores 202a and 202b inserted therein, respectively. On the other hand, the air-core inductor 204b is not provided with a core therein. The first core inductors 204a are connected to a stem 256 through stem terminals 256a and 256b, respectively. The second core inductors 204c are connected to a condenser 258.

Figure 2E:
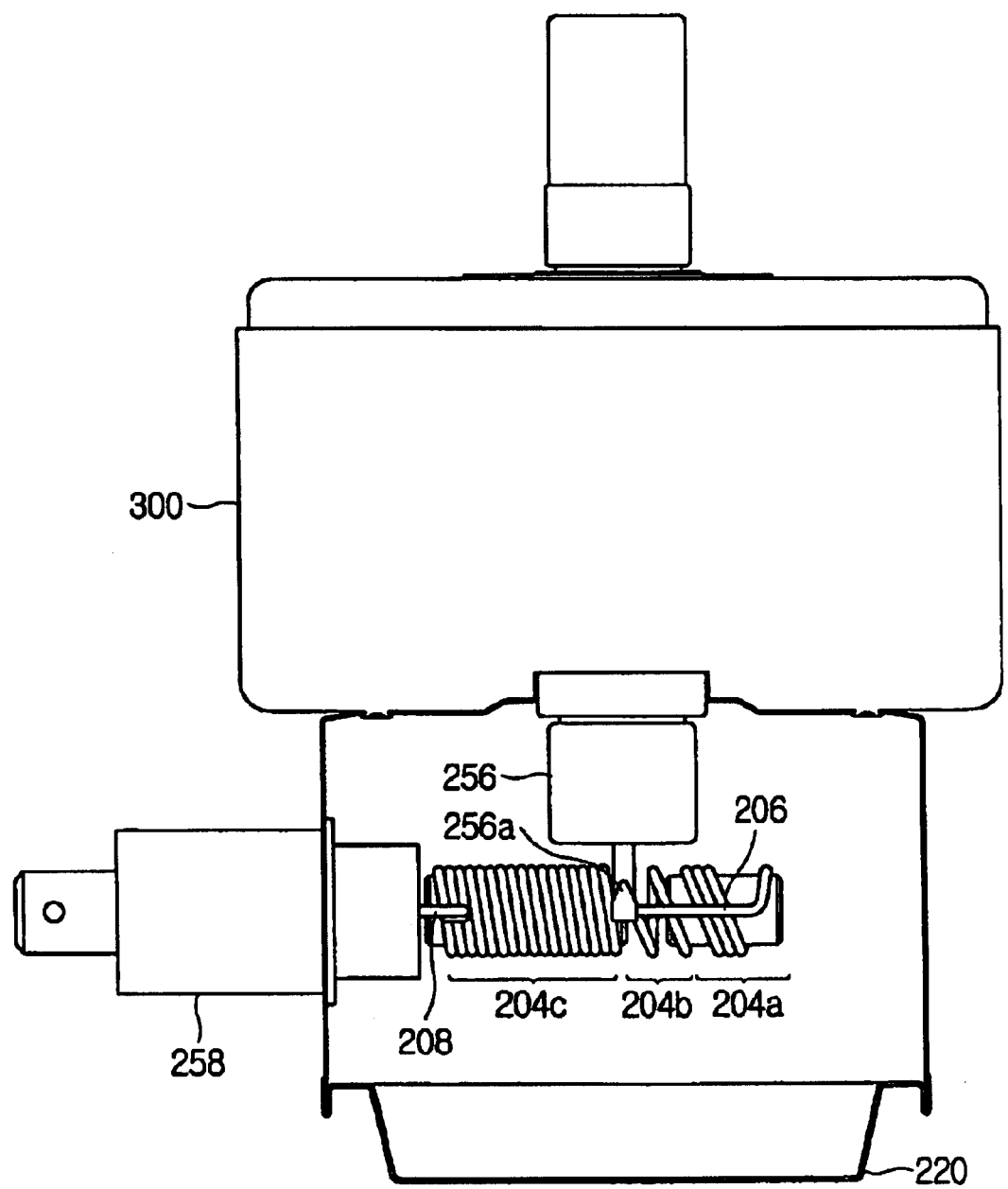
FIG. 2E is a sectional view of the noise filter of the high frequency generator of the present invention.

FIG. 2E is a sectional view of the noise filter of the high frequency generator of the present invention. As shown in FIG. 2E, the end 206 of the choke coil 204 which includes the first core inductor 204a, is connected to a magnetron 300 via the stem terminal 256a and the stem 256. The end 208 of the choke coil 204 which also includes the second core inductor 240c, is connected to the condenser 258.

Figure 3:
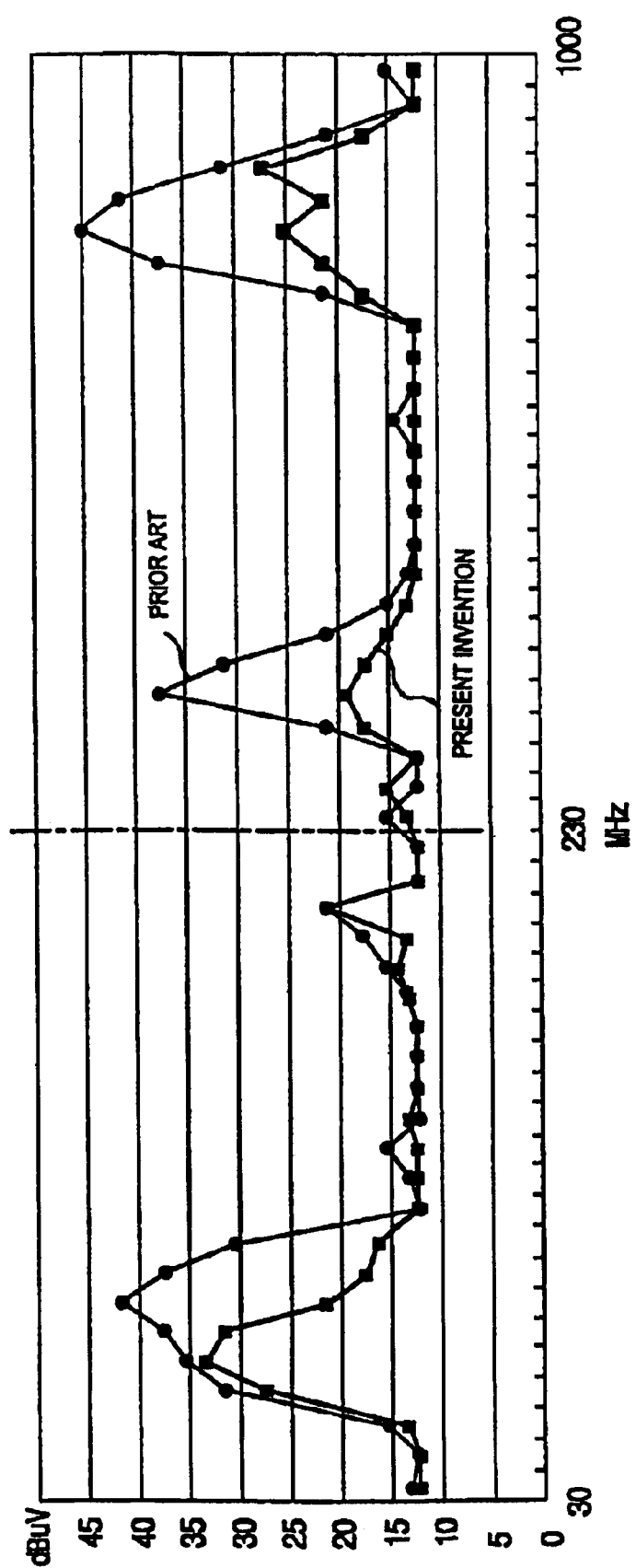
FIG. 3 is a graph illustrating results of a noise test of the noise filter of the high frequency generator of the present invention.

Through experimental results of a noise attenuation effect of the noise filter of the high frequency generator according to the present invention with the above-described construction, it is appreciated that the noise attenuation effect in a frequency band ranging from 400 MHz to 900 MHz is excellent. FIG. 3 is a graph illustrating results of a noise test of the noise filter of the high frequency generator of the present invention. Conditions of the test are as follows.

EN55011 or CISPR11, which is an electromagnetic interference protection standard, is used as a measurement standard. An Electro-Magnetic Interference (EMI) chamber, for example, 10 m EMI chamber or an open site test site, is used as a test site. Frequency bands of 30 MHz to 230 MHz and 230 MHz to 1000 MHz are employed as measurement frequency bands of noise. Noise measurement is performed when the high frequency generator employing the noise filter of the present invention is operated at its rated voltage with an output of the high frequency generator being maximized. 1000 cc of water regulated by CISPR 11 is used as a load at the time of noise measurement.

According to results of the test performed under the above-described test conditions, as shown in FIG. 3, it is seen that noise of a high frequency band is remarkably reduced in the high frequency generator employing the noise filter of the present invention, in comparison with a high frequency generator employing the conventional noise filter.

As described above, the noise filter of the high frequency generator of the present invention provides a noise attenuation effect in noise of a frequency band ranging from 400 MHz to 900 MHz leaked from the high frequency generator by a structure in which the first core inductor, the air-core inductor and the second core inductor are connected in series to each other.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A high frequency generator, comprising:
   a plurality of choke coils, each including a first core inductor, an air-core inductor and a second core inductor connected in series to each other, the first and second core inductors having high frequency-energy absorbing members inserted therein, and the air-core inductor is not provided with a high frequency-energy absorbing member therein.

2. The generator as set forth in claim 1, wherein said high frequency-energy absorbing member is made of one of iron oxide, tin alloy and ferrite.

3. The generator as set forth in claim 1, wherein said high frequency-energy absorbing member has a sectional area in which noise of a frequency band ranging from 400 MHz to 900 MHz is attenuated.

4. A noise filter of a high frequency generator, comprising:
   a plurality of choke coils each including a first core inductor, an air-core inductor and a second core inductor connected in series to each other, the first and second core inductors having high frequency-energy absorbing members inserted therein, and the air-core inductor is not provided with a high frequency-energy absorbing member therein,
   wherein the first core inductors are electrically connected to the high frequency generator and the second core inductors are connected to a condenser.

5. The generator as set forth in claim 4, wherein said high frequency-energy absorbing member is made of one of iron oxide, tin alloy and ferrite.

6. The generator as set forth in claim 4, wherein said high frequency-energy absorbing member is provided with a sectional area in which noise of a frequency band ranging from 400 MHz to 900 MHz is attenuated.

7. An apparatus, comprising:
   a magnetron to generate high frequency signals; and
   a noise filter connected to the magnetron to prevent the high frequency signals of the magnetron from leaking outside,
   wherein the noise filter includes a plurality of choke coils provided in a filter casing of the noise filter, each having a first core inductor, an air-core inductor and a second core inductor connected in series to each other.

8. The apparatus as set forth in claim 7, wherein the first and second core inductors are provided with first and second cores, respectively.

9. The apparatus as set forth in claim 8, wherein the first and second cores are high frequency-energy absorbing members made of one of iron oxide, tin alloy and ferrite.

10. The apparatus as set forth in claim 8, wherein said high frequency-energy absorbing members have a sectional area in which noise of a frequency band ranging from 400 MHz to 900 MHz is attenuated.

* * * * *